United States Patent [19]
Kaku

[11] Patent Number: 6,072,998
[45] Date of Patent: Jun. 6, 2000

[54] RADIO RECEIVER FOR RECEIVING A MODULATED DIGITAL SIGNAL

[75] Inventor: Tomoya Kaku, Tokyo, Japan

[73] Assignee: NEC Corporation, Japan

[21] Appl. No.: 08/967,156

[22] Filed: Nov. 10, 1997

[30] Foreign Application Priority Data

Nov. 12, 1996 [JP] Japan ..................................... 8-300410

[51] Int. Cl.[7] .................................................. H04B 1/06
[52] U.S. Cl. ................................... 455/234.2; 455/249.1; 455/250.1; 375/345
[58] Field of Search ............................. 455/232.1, 234.1, 455/234.2, 247.1, 249.1, 250.1, 254, 422, 504, 506, 522; 375/206, 344, 345

[56] References Cited

U.S. PATENT DOCUMENTS

| | | | |
|---|---|---|---|
| 4,955,077 | 9/1990 | Sugayama | 455/234.1 |
| 5,175,883 | 12/1992 | Ueno | 455/247.1 |
| 5,305,351 | 4/1994 | Mizoguchi | 375/345 |
| 5,361,395 | 11/1994 | Yamamoto | 375/345 |
| 5,390,345 | 2/1995 | Wada et al. | 455/234.1 |
| 5,408,698 | 4/1995 | Serizawa et al. | 375/345 |
| 5,548,619 | 8/1996 | Horiike et al. | 375/344 |
| 5,603,114 | 2/1997 | Tomita | 455/249.1 |
| 5,722,060 | 2/1998 | Horigome | 455/234.1 |
| 5,732,342 | 3/1998 | Roth et al. | 455/234.1 |
| 5,805,979 | 9/1998 | Miyashita | 455/234.1 |
| 5,825,806 | 10/1998 | Tuttle et al. | 375/206 |
| 5,887,246 | 3/1999 | Chevallier et al. | 455/232.1 |

FOREIGN PATENT DOCUMENTS

| | | |
|---|---|---|
| 5-335857 | 12/1993 | Japan . |
| 8-18469 | 2/1996 | Japan . |
| 8-8782 | 7/1996 | Japan . |
| WO 92/03892 | 3/1992 | WIPO .................................... 375/345 |
| WO 92/21179 | 11/1992 | WIPO .................................... 455/249.1 |

*Primary Examiner*—Dwayne D. Bost
*Assistant Examiner*—Nay Maung
*Attorney, Agent, or Firm*—Ostrolenk, Faber, Gerb & Soffen, LLP

[57] ABSTRACT

The object of the present invention is to provide a radio receiver, having a high reception sensitivity, that can limit cross-modulation even during the transmission of a signal that is related to frame synchronization and that has a signal strength different from that of another channel, and that can take into consideration the deterioration of a received signal caused by thermal noise. A gain controller is provided that employs the quality of received data detected by an error detector and the magnitude of a signal output by a band-pass filter in order to determine whether cross-modulation has occurred, and that controls the degree of attenuation provided by a variable gain attenuator provided at the front end of a reception unit.

9 Claims, 3 Drawing Sheets

RADIO RECEIVER FOR RECEIVING A MODULATED DIGITAL SIGNAL

BACKGROUND OF THE INVENTION

1. Field of the Invention

The present invention relates to a receiver for radio communication, such as a selective call receiver (a pager), a portable radio telephone or a cordless telephone, and in particular to a technique for restricting the effect of cross-modulation on a reception system.

2. Description of the Prior Art

Conventionally, in a common service area a plurality of carriers provide their services for mobile radio communication devices, such as selective call receivers (pagers), portable radio telephones or cordless telephones. In the service area, base stations for individual carriers are provided and facilitate communication.

In this situation, when a mobile radio device, for which a specific carrier (e.g., company A) provides a communication service, is moved near a base station of another carrier (e.g., company B), a plurality of signals transmitted by the base station of company B act as jamming signals for the mobile radio device. These jamming waves have a reception signal strength that is greater than the desired reception level for the communication service provided by company A.

In this case, even when a jamming signal transmitted by a base station of company B has a different frequency from that of a desired wave (company A), because of the nonlinear property of the receiver, the desired wave may be modulated by the jamming signal. Furthermore, when two or more strong jamming signals are present at the same time, a modulation product produced by the jamming signals is generated due to the non-linear property of the receiver, and affects the frequency of a desired wave that is received. As a result, even when the reception signal strength of the desired wave is sufficiently high, the desired wave can not be accurately received. Generally, these phenomena are known as cross-modulation and intermodulation, and are important elements that affect the performance of a radio receiver.

A conventional technique for reducing obstruction due to such cross-modulation and inter-modulation (hereinafter referred to simply as cross-modulation) will now be described while referring to FIGS. 1 and 2.

Figure 1:
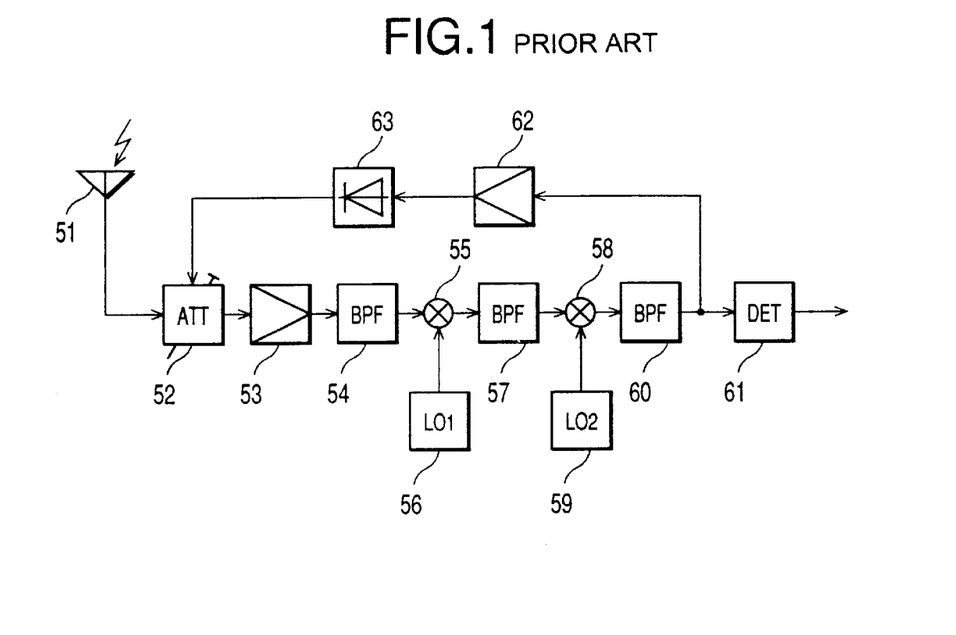
FIG. 1 is a block diagram illustrating a conventional ratio receiver.

FIG. 1 is a block diagram illustrating the arrangement as a reception system of a radio receiver employing a double superheterodyne reception system that is disclosed as prior art in Japanese Unexamined Patent Publication No. Hei 5-335857.

In the conventional radio receiver, a high frequency signal is received at an antenna 51, transmitted through a variable attenuator 52, and amplified by a high frequency amplifier 53. The amplified signal is passed through a high frequency band-pass filter 54 to a first frequency mixer 55. The frequency mixer 55 mixes the received signal with a first local oscillation signal LO1 that is output by a first local oscillator 56 and obtains a first intermediate frequency signal. The first intermediate frequency signal is passed through a first intermediate frequency filter 57 to a second frequency mixer 58. The second frequency mixer 58 mixes the first intermediate signal with a local oscillation signal LO2 that is output by a second local oscillator 59 and obtains a second intermediate frequency signal. The second frequency signal is passed through a second intermediate frequency filter 60 to a wave detector 61, and is output as a demodulation signal to a demodulation section provided at the next stage.

When a strong jamming signal is received from a base station of another carrier, jamming signal induces cross-modulation on a desired wave in the high frequency amplifier 53 and the first frequency mixer 55. To cope with this phenomenon, in the receiver in FIG. 1, the variable attenuator 52 reduces the level of a high frequency signal that is input to the high frequency amplifier 53 to limit the cross-modulation that is induced by the jamming signal.

In this case, to control the degree of attenuation provided by the variable attenuator 52, the second intermediate frequency signal is amplified by an amplifier 62, the resultant signal is rectified by a rectifier 63, and the obtained direct current voltage is supplied as a gain control signal to the variable attenuator 52. That is, when a jamming signal having a high reception signal strength is received, the signal strength of the intermediate frequency signal is increased, as is the direct current voltage of the rectifier 63. Since the direct current voltage is employed as a gain control signal, the degree of attenuation provided by the variable attenuator 52 is increased.

Another radio receiver is disclosed in Japanese Unexamined Patent Publication No. Hei 5-335857. This radio receiver employs a direct conversion reception system having a simplified reception circuitry that is compactly constructed to enhance its portability, and that limits the cross-modulation that is induced by a jamming signal. In FIG. 2 is shown the configuration of this radio receiver that employs the direct conversion reception system.

Figure 2:
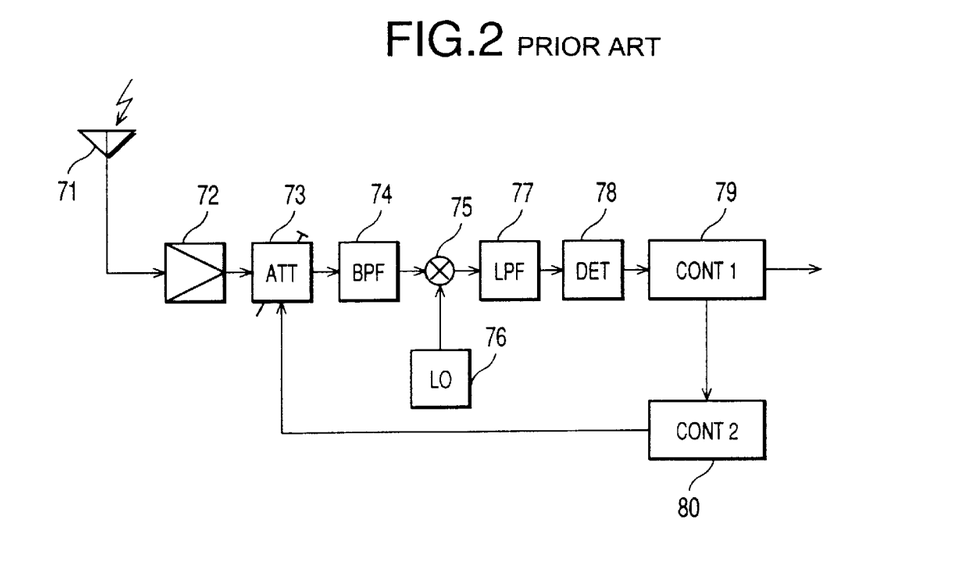
FIG. 2 is a block diagram illustrating another conventional ratio receiver.

In FIG. 2, the radio receiver comprises: a high frequency amplifier 72; a high frequency band-pass filter 74; a first frequency mixer 75; a local signal oscillator 76; a low-pass filter 77; a variable gain attenuator 73, for varying the strength of a received signal and outputting it along a signal path for a received signal; and a controller 79, for determining whether or not a predetermined frame sync signal is detected in base band signal data (DT) that is demodulated by a wave detector 78. If the controller 79 determines that a frame sync signal is not detected in the base band signal, a gain controller 80 generates a predetermined gain control voltage to increase the degree of attenuation provided by the variable gain attenuator 73. That is, according to the radio receiver, attention is drawn to the fact that, if cross-modulation is induced by a jamming signal, a predetermined signal is not detected in a received baseband signal of a desired wave. When it is ascertained that a predetermined sync signal is not detected in a demodulated baseband signal, the gain controller 80 reduces the gain of the variable gain attenuator 73 until it is equal to or lower than a predetermined value.

In addition, when the reception signal strength of the desired wave is reduced until it is equal to or lower than a predetermined threshold value, the gain controller 80 reduces the degree of attenuation provided by the variable gain attenuator 73 and recovers the gain. As a result, a problem can be prevented that occurs when, although normally a desired wave can be received satisfactorily, the desired wave can not be received at an adequate reception level because of the degree of attenuation provided by the variable gain attenuator 73.

However, for conventional radio receivers, the following problem has arisen concerning the control of the degree of attenuation provided by the variable gain attenuator in accordance with whether a predetermined signal is detected in a demodulated baseband signal.

Specifically, according to TIA.IS-95, which is the North American Standard for a radio communication system that employs a code division multiple access (CDMA) method using a direct sequence spread spectrum (DS-SS), a signal (a pilot channel signal) related to frame synchronization is transmitted with higher strength than another channel signal (an information signal such as a traffic signal that a user actually uses) by a base station. Thereafter, when a jamming signal having a strong signal is received, although a channel signal (an information signal such as a traffic signal) desired for reception is affected by cross-modulation, the conventional technique receives and detects a pilot channel signal having stronger strength, so that gain control is not satisfactorily exercised, and as a result, cross-modulation due to a jamming signal can not be adequately limited.

Furthermore, when cross-modulation also occurs after frame synchronization is acquired, adequate gain control can not be exercised and a satisfactory reception quality can not be maintained.

Further, the above described conventional radio receiver can not exercise adequate control when a frame sync signal can not be detected for a reason other than the occurrence of cross-modulation.

SUMMARY OF THE INVENTION

It is, therefore, one object of the present invention to provide a radio receiver that limits the effect of cross-modulation and that has a high reception sensitivity.

Specifically, it is the object of the present invention to provide a radio receiver, having high reception sensitivity, that can limit cross-modulation due to a jamming signal not only when a signal related to frame synchronization is transmitted at the same signal strength as that of another channel signal, but also when, according to TIA.IS-95, a signal related to frame synchronization is transmitted with a higher signal strength than that of another channel signal.

It is another object of the present invention to provide a radio receiver, having high reception sensitivity, that can limit the effect of cross-modulation even when it occurs after synchronization has been acquired, and that can take into account deterioration of a received signal due to a phenomenon other than cross-modulation, i.e., thermal noise.

To achieve the above object, according to the present invention, a radio receiver for receiving a modulated digital signal comprises:

variable gain attenuation means for limiting a signal level of a high frequency signal that is received;

high frequency amplification means for amplifying the high frequency signal output by the variable gain attenuation means;

frequency conversion means for converting the high frequency signal that is amplified into an intermediate frequency signal;

a band-pass filter for permitting a passage only of predetermined frequency band of the intermediate frequency signal;

variable gain intermediate frequency amplification means for amplifying a signal passed through the band-pass filter and for exercising automatic gain control to output an amplified signal having constant average power;

demodulation means for demodulating a signal output by the variable gain intermediate frequency amplification means to obtain a baseband signal, and for outputting received data;

error detection means for detecting an error in the received data and for outputting a quality deterioration index representing deterioration of quality of the received data; and gain control means for employing the magnitude of a signal output by the band-pass filter and the quality deterioration index to control the degree of gain attenuation performed by the variable gain attenuation means, the gain control means ascertaining, when deterioration in a quality of the received data is detected based on the quality deterioration index, that the quality of the high frequency signal that is received has been deteriorated, and increasing the degree of gain attenuation provided by the variable gain attenuation means when the magnitude of the signal output by the band-pass filter is equal to or greater than a predetermined value, and reducing the degree of gain attenuation when the magnitude of the signal is smaller than the predetermined value.

In the above structured radio receiver, the variable gain attenuation means, which is provided at the front end of the reception unit, attenuates the level of a received high frequency signal, which is to be input to a high frequency amplifier at the next stage, in order to limit the cross-modulation that will occur by the non-linear property of the receiver when a strong jamming signal is received.

A high frequency signal that passes through the variable gain attenuation means is amplified by the high frequency amplification means, and the frequency of the resultant signal is changed by the frequency conversion means to a frequency in a frequency band that is adequate for the amplification of signals in the radio receiver to obtain an intermediate frequency signal. The frequency conversion means can be a frequency converter that is constituted by a local wave oscillator, for oscillating a local wave, and a frequency mixer, for mixing a desired wave and a locally oscillated wave to form an intermediate frequency that is the sum of, or the difference between, the two waves.

The intermediate frequency signal is output to the band-pass filter to extract a signal in a predetermined frequency band that is required for the demodulation of signals that are distributed along the axis of frequency, with the intermediate frequency as the center.

A signal that passes through the band-pass filter is amplified, before demodulation, by the intermediate frequency amplification means to improve gain. At this time, by providing, in parallel to an amplifier, an amplitude limiter or automatic gain controller, the intermediate frequency means exercises automatic gain control to output a signal having a constant average power to the demodulation means at the next stage. This is particularly important for communication between portable devices during which the level of a received high frequency signal drastically varies, and can eliminate, from a parameter that is related to the field intensity of a received signal, the occurrence of the effect during the subsequent demodulation and error detection procedures.

The demodulation means detects a modulated signal and outputs a baseband signal.

In order to limit the effect due to cross-modulation, according to the present invention attention is focused on the fact that when there is deterioration of the quality of a high frequency signal by cross-modulation, there is also deterioration of a baseband signal obtained by demodulation, and the degree of attenuation provided by the variable gain attenuation means is controlled by employing, as parameters, the quality of the received data and the magnitude of a signal output by the band-pass filter. Specifically, when the reception level of a desired signal is considerably higher than that of thermal noise, a demodulated baseband signal, i.e., the index representing the quality of received data, is employed to control the degree of attenuation provided by the variable gain attenuation means located at the front end of the reception unit. Furthermore, whether the deterioration of a received high frequency signal is caused by cross-modulation or by thermal noise is determined by referring to the magnitude of a signal output by the band-pass filter. According to the determination, the level of a signal that is to be sequentially input to the reception block is adjusted to limit cross-modulation. When the reception quality is improved, gain is also improved by reducing the degree of attenuation provided by the variable gain attenuator, so that deterioration of the reception quality due to thermal noise can be prevented.

Therefore, the radio receiver of the present invention comprises the error detection means for detecting and measuring deterioration of the quality of received data, and gain control means for employing the detection result to control the degree of attenuation provided by the variable gain attenuation means.

The error detection means includes all means used for evaluating the quality of received data, and employs the result of an evaluation to output a quality deterioration index that represents the extent of the deterioration of the quality of a baseband signal. For example, the error detection means conducts parity checking for a received frame, and outputs the result as a quality deterioration index. In this case, the quality deterioration index is either "0" or "1." The error detection means may perform error determination, such as parity checking, for a predetermined number of symbols or frames, may count the symbols or frames for which an error was detected, and may output the symbol error count (bit error count) or the frame error count as a quality deterioration index. Further, the error detection means may determine the maximum likelihood and employ it as the quality deterioration index. In addition, as a quality deterioration index, a symbol error count or a frame error count, or the likelihood that results from the determination of the maximum likelihood, may be output by the error detection means; but the quality deterioration index may be calculated based on one, or more than two of these values.

Deterioration of the quality of received data will occur not only when cross-modulation occurs but also when a desired wave does not have a satisfactorily high field intensity relative to thermal noise. When a strong jamming signal is received and cross-modulation occurs, deterioration of the quality of a baseband signal occurs and the output of the band-pass filter is also increased. On the other hand, when deterioration of the quality of the baseband signal is caused by thermal noise, generally, a signal output by the band-pass filter carries comparatively weak thermal noise.

When the deterioration of the quality of the received data is detected, therefore, the gain control means employs the magnitude of the signal output by the band-pass filter, i.e., the maximum power value or the average power value, to determine whether the deterioration of the quality is caused by cross-modulation or by thermal noise. That is, when the quality deterioration index exceeds a predetermined value and when the magnitude of the signal output by the band-pass filter is large, the gain control means ascertains that cross-modulation occurred and increases the degree of attenuation provided by the variable gain attenuation means. As a result, the effect due to the cross-modulation can be limited. In addition, when the magnitude of the signal output by the band-pass filter is small, even though quality deterioration exceeds the predetermined value, the gain control means ascertains that thermal noise is the cause of the deteriorated in the quality of a baseband signal, and reduces the degree of attenuation provided by the variable gain attenuation means.

With the above arrangement, cross-modulation due to a jamming signal can be limited not only when a signal related to frame synchronization is transmitted with substantially the same signal strength as that of another channel signal, but also when a signal related to the frame synchronization according to TIA.IS-95 is transmitted with a signal strength higher than that of another channel signal. Furthermore, in an environment where cross-modulation occurs after synchronization has been established, the effect of cross-modulation can be limited.

In addition, when deterioration of the quality of a received high frequency signal is caused by a phenomenon other than cross-modulation, i.e., thermal noise, the degree of attenuation provided by the variable gain attenuation means is reduced, so that the reception sensitivity can be enhanced.

As is described above, according to the present invention, the degree of attenuation provided by the variable gain attenuation means is controlled by the gain control means by using, as parameters, the quality deterioration index output by the error detection means and the magnitude of the output of the band-pass filter. In particular, according to the invention cited in claim 2, the error detection means detects and measures errors in the received data and outputs the quality deterioration index, and the gain control means includes comparison means for comparing a quality deterioration threshold value, which is determined in advance for the quality deterioration index, with the quality deterioration index output by the error detection means.

When the quality deterioration index output by the error detection means exceeds the quality deterioration threshold value, it is ascertained that deterioration of the quality of the high frequency signal that is received has occurred.

Any type of index representing the quality of received data can be employed as a quality deterioration index. Particularly in the invention defined in claim 3, the error detection means detects and measures symbol errors included in the received data, and outputs as the quality deterioration index a symbol error count for a predetermined number of frames.

Further, according to the invention defined in claim 4, the error detection means detects and measures an error in a received frame by using for error detection a symbol that is added in advance to the frame, and outputs as the quality deterioration index a frame error count for a predetermined number of frames.

In addition, according to the invention defined in claim 5, the error detection means measures a frame error count in the received frame by using a likelihood obtained by determining a maximum likelihood, and outputs the frame error count as the quality deterioration index.

Since multiple values or sequential values are employed for a quality deterioration index, a more stable reception sensitivity can be obtained.

Furthermore, according to the invention defined in claim 6, the gain control means includes:

first storage means for storing a first threshold value for quality deterioration that is defined in advance relative to the quality deterioration index;

first comparison means for comparing the first threshold value stored in the first storage means with the quality deterioration index output by the error detection means;

second storage means for storing a second threshold value that is defined in advance for the magnitude of the signal output by the band-pass filter;

second comparison means for comparing the second threshold value stored in the second storage means with the magnitude of the signal output by the band-pass filter; and control signal output means for employing a result obtained by the first comparison means and a result obtained by the second comparison means to output a control signal for controlling the degree of attenuation provided by the variable gain attenuation means, the signal output means ascertaining, when the first comparison means determines that the quality deterioration index exceeds the first threshold value, that deterioration of the quality of the high frequency signal has occurred and outputting either a control signal to increase the degree of attenuation provided by the variable gain attenuation means, when the second comparison means determines that the magnitude of the signal output by the band-pass filter is equal to or greater than the second threshold value, or a control signal to reduce the degree of attenuation, when the second comparison means determines that the magnitude of the signal output by the band-pass filter is smaller than the threshold value.

That is, while the first threshold value is employed to detect the deterioration of the quality of received data, the second threshold value is employed to determine whether the deterioration of the quality is caused by cross-modulation or by thermal noise. With this arrangement, when the deterioration of the quality of received data is caused by cross-modulation, the degree of attenuation provided by the variable gain attenuation means is increased. And when deterioration of the quality of the received data is caused by thermal noise, the degree of attenuation is reduced. As a result, a radio receiver having a high reception sensitivity can be provided.

According to the invention defined in claim 7, the gain control means includes:

first storage means for storing a first threshold value for quality deterioration that is defined in advance relative to the quality deterioration index;

first comparison means for comparing the first threshold value stored in the first storage means with the quality deterioration index output by the error detection means;

second storage means for storing a second threshold value that is defined in advance for the magnitude of the signal output by the band-pass filter;

second comparison means for comparing the second threshold value stored in the second storage means with the magnitude of the signal output by the band-pass filter;

third storage means for storing a third threshold value for quality recovery that is smaller than the first threshold value and that is defined in advance for the quality deterioration index;

third comparison means for comparing the third threshold value stored in the third storage means with the quality deterioration index output by the error detection means;

control signal output means for employing a result obtained by the first comparison means, a result obtained by the second comparison means and a result obtained by the third comparison means to output a control signal for controlling the degree of attenuation provided by the variable gain attenuation means, the control signal output means ascertaining, when the first comparison means determines that the quality deterioration index exceeds the first threshold value, that deterioration of the quality of the high frequency signal has occurred, and the control signal output means outputting, when the second comparison means determines that the magnitude of the signal output by the band-pass filter is equal to or greater than the second threshold value, a control signal to increase the degree of attenuation provided by the variable gain attenuation means until the quality deterioration index is smaller than the threshold value for quality recovery stored in the third storage means, or outputting, when the second comparison means determines that the magnitude of the signal output by the band-pass filter is smaller than the threshold value, a control signal to reduce the degree of attenuation; and updating means for, when the degree of attenuation provided by the variable gain attenuation means is increased by the control signal output means and the third comparison means determines that the quality deterioration index is smaller than the third threshold value for the quality recovery, updating the second threshold value stored in the second storage means, the updating means updating the contents stored in the second storage means by employing the magnitude of a signal currently output by the band-pass filter as a new second threshold value.

With this arrangement, when the quality of received data is improved by increasing the degree of attenuation, the magnitude of the output of the band-pass filter is employed as a new second threshold value that serves as a reference for determining whether the deterioration of the quality of received data is caused by cross-modulation or by thermal modulation, so that gain control consonant with the change in the situation is exercised. As a result, a radio receiver having high reception sensitivity can be provided.

The first, the second and the third storage means include all means that are used for the recording of data, such as ROMs, RAMs and registers. The first, the second and the third comparison means may be constituted by a comparator, or by a microcomputer and a program that enables the performance of comparison by the computer. Similarly, the control signal output means may be constituted by an analog circuit or a digital circuit, or by a microcomputer and a program.

The present invention can be applied for a radio receiver for receiving a modulated digital signal, regardless of the modulation system that is used. In particular, according to the invention cited in claims 8 and 9, provided is a radio receiver for employing pseudo-noise (PN) sequence to receive modulated digital signals obtained by direct sequence spread spectrum modulation.

According to the radio receiver defined in claim 8, the frequency conversion means performs de-spread processing by multiplying the high frequency signal, which is obtained by performing direct sequence spread spectrum modulation using the PN sequence, by the PN sequence that is employed for the direct sequence spectrum modulation, and converts the high frequency signal into an intermediate frequency signal.

In the invention in claim 8, the intermediate frequency signal thus provided is demodulated to obtain a baseband signal, and the quality of the baseband signal and the magnitude of a signal output by the band-pass filter are employed to adjust the degree of attenuation provided by the variable gain attenuation means.

According to the radio receiver defined in claim 9, the frequency conversion means converts the high frequency signal, which is obtained by the direct sequence spectrum modulation using a PN sequence, into an intermediate frequency signal; the band-pass filter permits the passage only of predetermined frequency band elements of the intermediate frequency signal that correspond to the PN sequence used for the direct sequence spectrum modulation;

and in order to obtain the baseband signal that is multiplied by the PN sequence, the demodulation means demodulates a signal output by the variable intermediate frequency amplification means and, in order for the received data to be decoded, performs inverted spread processing by multiplying the baseband signal by the same PN sequence as is used for the direct sequence spectrum modulation.

In the thus structured invention defined in claim 9, a digital signal multiplied by a PN sequence is employed as a baseband signal. The demodulation means demodulates the intermediate frequency signal to provide a baseband signal for which de-spread processing is performed using the PN sequence. The demodulation means at the following stage multiplies the resultant digital signal by the PN sequence to provide a digital signal that was received. Therefore, the band-pass filter of the present invention is a wide band-pass filter having a bandwidth through which a modulated signal that spread by the PN sequence can be passed.

The gain control means employs the magnitude of the spread baseband signal, which is passed through the wide band-pass filter, and the quality deterioration index to control the degree of attenuation provided by the variable gain attenuation means.

DETAILED DESCRIPTION OF THE PREFERRED EMBODIMENT

The preferred embodiment of the present invention will now be described while referring to the accompanying drawings.

Figure 3:
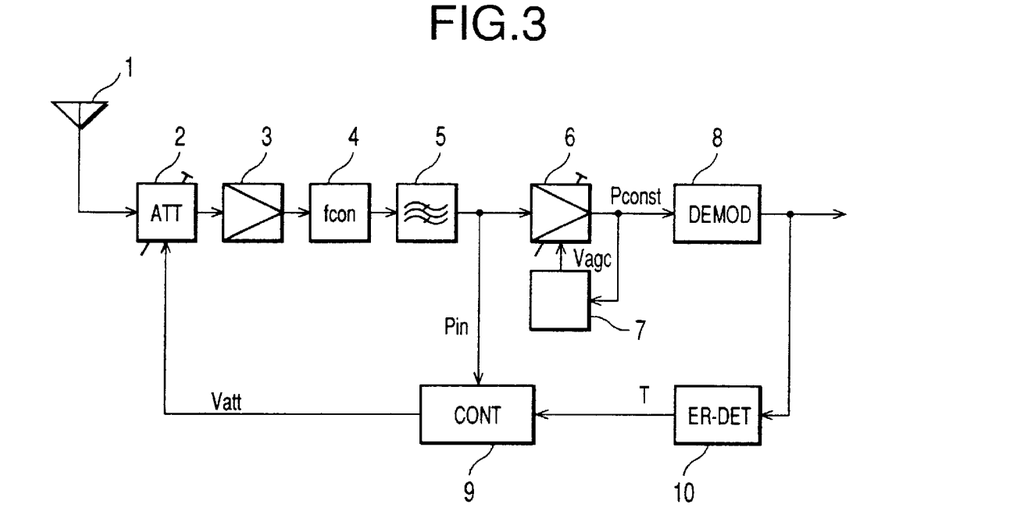
FIG. 3 is a block diagram illustrating a radio receiver according to one embodiment of the present invention.

FIG. 3 is a block diagram illustrating a radio receiver according to one embodiment of the present invention.

This radio receiver receives and demodulates a digital modulated signal for which direct sequence spectrum spread has been performed, while limiting the effect of cross-modulation. The radio receiver comprises: an antenna 1, for receiving a signal; a variable gain attenuator 2, for controlling the level of a signal input to a reception block; a high frequency signal amplifier 3; a frequency converter 4, for converting a received high frequency signal into an intermediate frequency signal; a band-pass filter 5, for permitting only a predetermined frequency band to pass; a variable gain amplifier 6, for amplifying a gain of a signal that passes through the band-pass filter 5; an automatic gain controller 7, for controlling a gain to maintain a constant power output by the variable gain amplifier 6; a demodulator 8, for demodulating a baseband signal and for performing the de-spread processing; an error detector 10, for detecting, from the output of the demodulator 8, a frame error count for a predetermined frame; and a gain controller 9, for employing the frame error count output by the error detector 10 and the value of the power output by the band-pass filter 5 to control the degree of attenuation provided by the variable gain attenuator 3.

The variable gain attenuator 2, provided at the front end of the reception unit, serves as variable gain attenuation means. Specifically, the variable gain attenuator 2 reduces the level of a high frequency signal that is to be input to the high frequency amplifier 3 at the next stage, and thus limits the cross-modulation that occurs upon receipt of a strong jamming signal due to the non-linear characteristics of the receiver.

The high frequency signal that has been attenuated by the variable gain attenuator 2 is amplified by the high frequency amplifier 3, and the frequency of the resultant signal is changed by the frequency converter 4 in a frequency band that is adequate for signal amplification in the radio receiver. The high frequency amplifier 3 performs low-noise amplification for a weak radio wave to improve the S/N ratio of the radio receiver, and, therefore, enhances frequency sensitivity. It is preferable that there be little distortion. The frequency converter 4 can be constituted by a local oscillator, for oscillating a local transmission wave, and a frequency mixer, for mixing the local wave and the high frequency signal to provide an intermediate signal that is the sum of or the difference between the two signals (neither of these components is shown in FIG. 3).

The band-pass filter 5 extracts a signal in a predetermined frequency band that is required for the demodulation of signals that spread along the frequency axis with the intermediate frequency serving as the center. In this embodiment, since a signal that passes through the band-pass filter 5 must include a PN sequence that was used for spread spectrum, a wide band-pass filter is employed that has a bandwidth corresponding to the frequency spectrum for a PN sequence with the intermediate wave signal serving as the center.

The band-pass filter can not only be an LC tuning circuit, but can also be a crystal filter, a ceramic filter or a surface acoustic wave filter.

The variable gain controller 6, for amplifying the gain of a signal that passes through the band-pass filter 5, and the automatic gain controller 7, for controlling the gain to maintain a constant power output by the variable gain amplifier 6, constitute variable gain intermediate frequency amplification means for exercising automatic gain control. The automatic gain controller 7 receives the output power of the amplified signal, and outputs a control voltage Vagc to control the gain of the variable gain controller 6, so that an amplified signal is output that has a constant average power Pconst. Since the power of a signal to be input to the demodulator 8 is constant, the effect of the power during demodulation and error detection is eliminated, and the stable operation of the receiver is ensured.

The variable intermediate frequency amplification means, for performing automatic gain control, may be constituted by the variable gain amplifier 6, an amplitude limiter (not shown in FIG. 3), for receiving the output of the variable gain amplifier 6, and the automatic gain controller 7, for automatically controlling the gain of the variable gain amplifier 6 based on a signal from the amplitude limiter.

The demodulator 8 includes a coherent detector, for demodulating the intermediate frequency signal, for which phase-shift keying (PSK) has been performed, to obtain a baseband signal that is multiplied by a PN sequence; a PN sequence generator, for generating the same PN sequence as is used by a transmission side, to perform spreading and modulation; and a decoder, for performing de-spreading process, by multiplying the obtained baseband signal by the PN sequence, and for outputting a digital signal.

The radio receiver according to the embodiment has the error detector 10 for detecting deterioration of the received signal quality by the output by the demodulator 8. In this embodiment, the error detector 10 employs CRC (Cyclic Redundancy Code) or a parity bit, which is added in advance to an information frame to be transferred, to detect and count frame errors that occur in a predetermined number of frames, e.g., 100 frames, and outputs the detected frame error count as quality deterioration index T.

When a received high frequency signal is deteriorated by cross-modulation, or when thermal noise is superimposed on a received high frequency signal due to the condition of a communication path, the quality of data output by the demodulator 8 is deteriorated and the value of quality deterioration index T output by the error detector 10 is increased.

The gain controller 9 controls the degree of attenuation provided by the variable gain attenuator 2 in consonance with the quality deterioration index T and the magnitude of a signal output by the band-pass filter 5. Control is exercised as follows.

First, when the quality deterioration index T exceeds a predetermined value, the gain controller 9 ascertains whether the deterioration of the quality of a received high frequency signal is caused by a specific cause, and refers to the power value Pin output by the band-pass filter 5.

When the value Pin is equal to or greater than a predetermined value, it is assumed that cross-modulation has occurred, and the gain controller 9 increases the degree of attenuation provided by the variable gain attenuator 2. When the value Pin is smaller than the predetermined value, the gain controller 9 reduces the degree of attenuation.

Figure 4:
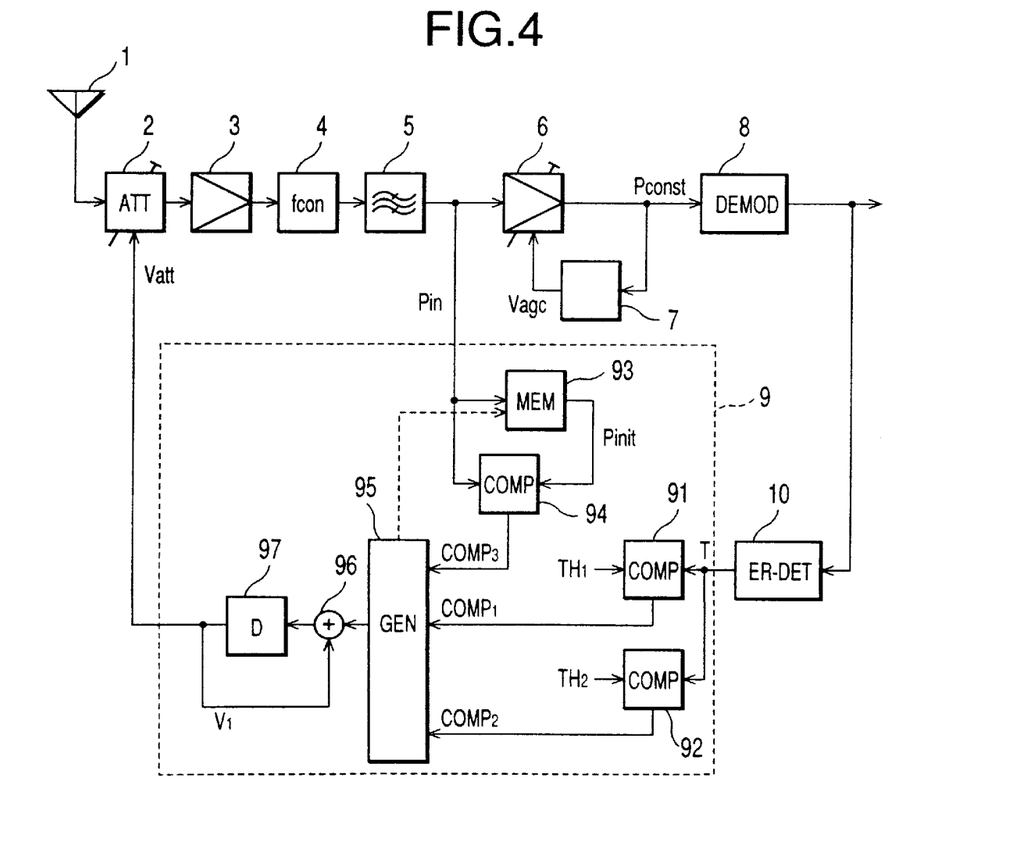
FIG. 4 is a block diagram illustrating the radio receiver according to the embodiment of the present invention, and in particular, showing in detail the arrangement of a gain controller.

The arrangement and the control operation of the gain controller 9 will now be explained while referring to FIG. 4. FIG. 4 is a diagram showing the arrangement for the gain controller 9 of the radio receiver shown in FIG. 3.

The gain controller 9 of the radio receiver in this embodiment includes two comparators 91 and 92, for performing comparisons for the quality deterioration index T; a memory section 93, for storing a predetermined value Pinit that is established for power output by the band-pass filter 5; a comparator 94, for comparing the value Pinit with the output power value Pin of the band-pass filter 5; a gain control signal generator 95, for generating a gain control signal to control the degree of attenuation provided by the variable gain attenuator 2; an adder 96; and a delay element 97.

This configuration is provided by storage means, such as a memory or a register, and computation means, such as a CPU.

Relative to the frame error count output by the error detector 10, i.e., the quality deterioration index T, two threshold values TH1 and TH2 are defined in advance for the respective comparators 91 and 92. The threshold value TH1 is related to quality deterioration and the threshold value TH2 is related to quality recovery. Of these two threshold values, there is a relation of TH1>TH2. The comparators 91 and 92 compare the quality deterioration index T with the threshold values TH1 and TH2, respectively, and output the results COMP1 and COMP2 to the control signal generator 95.

The memory section 93 stores the threshold value Pinit in conjunction with the power value Pin received from the band-pass filter 5. The threshold value Pinit is employed when there is deterioration of the quality of received data to determine whether or not the deterioration is caused by cross-modulation. The comparator 94 compares the output power value Pin of the band-pass filter 5 with the threshold value Pinit stored in the memory section 93, and outputs the result COMP3 to the control signal generator 95.

The control signal generator 95 employs signals COMP1 and COMP3, output by the comparators 91 and 94, to generate a control signal that corresponds to a change in the degree of attenuation provided by the variable gain attenuator 2. The adder 96 calculates the sum of the output of the control signal generator 95 and a gain control signal Vi, which has been delayed by a delay element 97, and outputs the sum, as a new gain control signal Vatt, to the variable gain attenuator 2 via the delay element 97. As is apparent from the above description, the control signal generator 95, the adder 96 and the delay section 97 constitute control signal output means.

Although not shown in FIG. 4, the control signal generator 95 also serves as a stored content updating means. When, in accordance with the result COMP2 obtained by the comparison performed with the TH2 that represents the quality recovery, it is ascertained that the quality of the received data has been improved, the control signal generator 95 stores a current output power value Pin for the bandpass filter 5 as a new value Pinit in the memory section 93.

For convenience sake, Vi is used to represent the Vatt held by the delay section 97.

Figure 5:
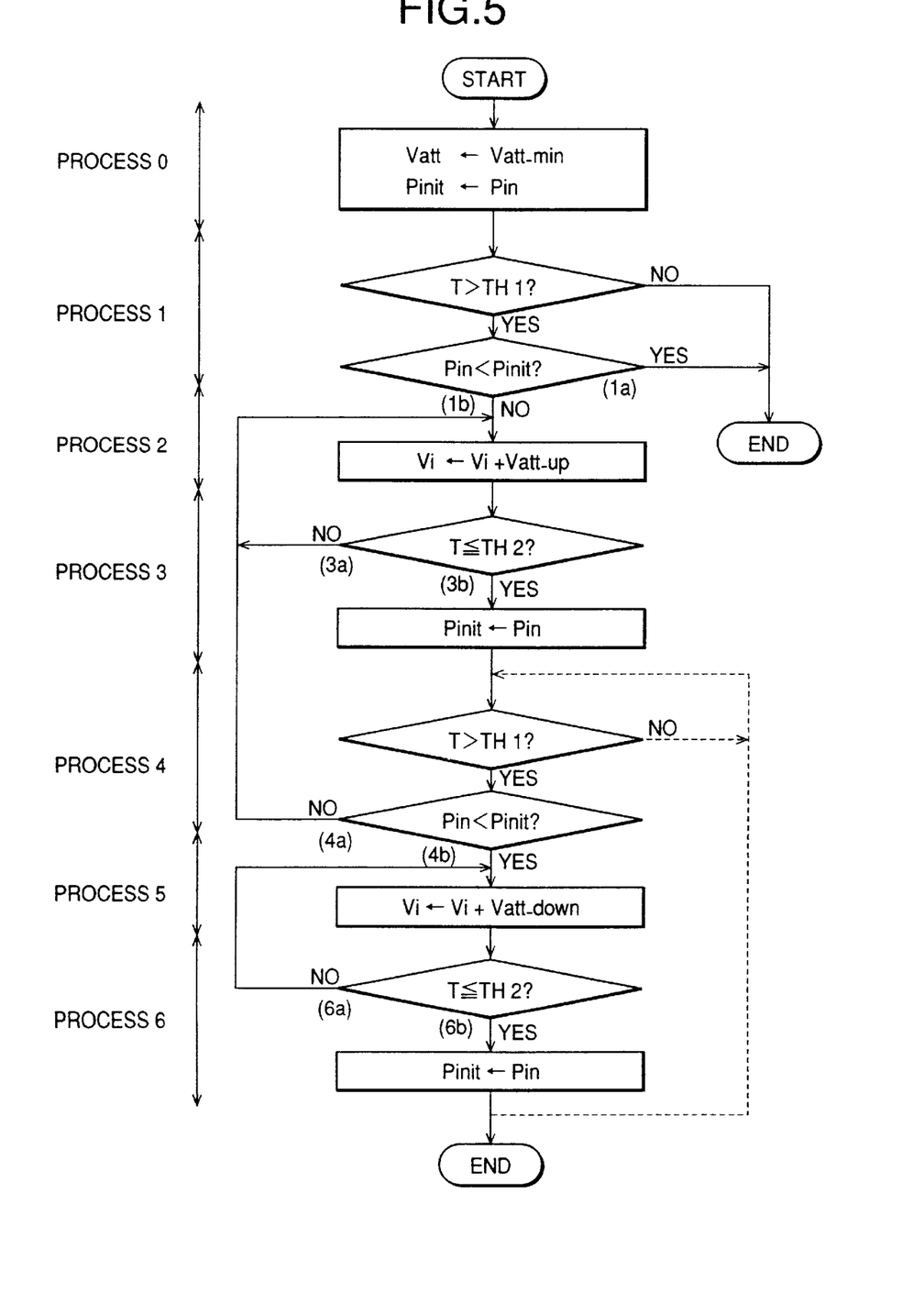
FIG. 5 is a flowchart of control processing for the gain controller shown in FIG. 4.

Now, the control operation of the gain controller 9 will now be described while referring to a flowchart in FIG. 5.

(Process 0) First of all, control signal voltage Vatt_min is set in the delay section 97 to establish a minimum degree of attenuation provided by the variable gain attenuator 2. In other words, a maximum gain is set for the variable gain attenuator 2.

The control signal generator 95 stores the output voltage Pin for the band-pass filter as Pinit in the memory section 93. (Process 1) The comparator 91 compares the quality deterioration index T, output by the error detector 10, with the threshold value TH1, which indicates quality deterioration, and refers to the output COMP1 of the comparator 91. When T is equal to or smaller than TH1 (T<TH1), it is assumed that demodulation of a received high frequency signal is preferably performed, and the control signal generator 95 outputs a 0 to the adder 96. As a result, Vatt_min is continuously output to the variable gain 5 attenuator 2.

When T exceeds TH1 (when T>TH1 is detected), it is assumed that there has been deterioration of the quality of the received data because the quality of a received high frequency signal is deteriorated by a specific cause. Then, the result COMP3 that is obtained when the comparator 94 compares Pin with Pinit is referred to, and the following processes are performed.

(Process 1a) When the result COMP3 is "Pin<Pinit," it is assumed that there has been deterioration of the quality of the received data because a high frequency signal having a sufficiently high signal strength relative to thermal noise can not be received, and the processing is thereafter terminated.

(Process 1b) When the result COMP1 is "Pin≧Pinit," it is assumed that deterioration of the quality of the received data may have occurred as a result of cross-modulation, and program control advances to process 2, whereat the gain controller 9 exercises control of the variable gain attenuator 2.

(Process 2) In response to the result obtained at process 1b, the gain control signal generator 95 outputs a signal for reducing the gain of the variable gain attenuator 2, i.e., a signal Vatt_up (Vatt_up>0) for increasing the degree of attenuation, to the adder 96. The adder 96 adds the Vatt_up and the value Vi held by the delay section 97. The delay section 97 holds the result "Vi+Vatt_up" as a new value Vi, and also outputs it as Vatt to the variable gain attenuator 2.

Procedure then advances to process 3 whereat the result is examined after the degree of attenuation has been increased.

(Process 3) The comparator 92 compares the quality deterioration index T with the threshold value TH2 for quality recovery, and while the output COMP2 is referred to, the following processes are performed.

(Process 3a) When the result COMP2 is "T>TH2," it is assumed that cross-modulation has not been sufficiently limited, and program control returns to process 2.

Process 2 is repeated until it is ascertained that the quality of the received data has been recovered. The control voltage Vatt is sequentially changed and the degree of attenuation provided by the variable gain attenuator 2 is increased.

(Process 3b) When the result COMP2 is "T≦TH2," the gain controller 9 assumes that the quality of the received data has been recovered, and stores as a new Pinit the power value Pin for a signal output by the band-pass filter 5. Procedure thereafter moves to process 4.

(Process 4) As well as in process 1, comparison result COMP1 is referred to, which is obtained when the comparator 91 compares the quality deterioration index T with the threshold value TH1 and which indicates deterioration of the quality of received data has occurred.

When T is equal to or smaller than TH1 (T≦TH1), it is assumed that reception and demodulation of the high frequency signal is being preferably performed, and the control signal generator 95 outputs a 0 to the adder 96 and the gain controller 9 outputs current Vatt. In other words, the current degree of attenuation provided by the variable gain attenuator 2 is maintained.

When T exceeds TH1 (when "T>TH1" is detected), it is assumed that deterioration of the quality of the received high frequency signal has occurred by a specific cause. The result COMP3 is referred to, which is obtained when the comparator 94 compares the Pin with the updated Pinit, and the following processes are performed.

(Process 4a) When the result COMP3 is "Pin≧Pinit," it is assumed that deterioration of the received high frequency signal by cross-modulation is still occurring, and procedure returns to process 2. In process 2, the degree of attenuation provided by the variable gain attenuator 2 is further increased.

(Process 4b) When the result COMP3 is "Pin<Pinit," it is assumed that the deterioration of the quality of the received data is due to thermal noise. Procedure moves to step 5 to reduce the degree of attenuation provided by the variable gain attenuator 2.

(Process 5) In response to the receipt of the data from process 4b, the gain control signal generator 95 outputs to the adder 96 a signal Vatt_down (Vatt_down<0) to reduce the degree of attenuation provided by the variable gain attenuator 2. The adder 96 adds the signal Vatt_down to the value Vi held by the delay section 97, and outputs the result "Vi+Vatt_down" as a new value Vi to the delay section 97. The delay section 97 outputs the new value Vi as a new Vatt to the variable gain attenuator 2 to reduce the degree of attenuation provided by the variable gain attenuator 2, i.e., to increase the gain. Procedure then advances to process 6 to check the result obtained after the degree of attenuation was reduced.

(Process 6) The comparator 92 compares the quality deterioration index T with the threshold value TH2 indicating quality recovery, and while the obtained result COMP2 is referred to, the following processes are performed.

(Process 6a) As a result of the reduction in the degree of attenuation effected in process 5, when the result COMP2 is "T>TH2," i.e., when it is ascertained that the quality of received data has not yet been recovered because of thermal noise, procedure returns to process 5 to reduce the degree of attenuation provided by the variable gain attenuator 2. The gain control signal generator 95 gain outputs the signal Vatt_down to the adder 96, and changes the control voltage Vatt until the quality of the received data has been recovered, i.e., until the result COMP2 is "T≦TH2."

(Process 6b) When, as a result in process 5, the result COMP2 is T≦TH2, i.e., when the quality of received data has been recovered, the current power value Pin for a signal output by the band-pass filter 5 is stored in the memory section 93 and the value Pinit is updated. Procedure thereafter returns to process 4.

As is described above, according to the radio receiver in this embodiment, the gain (degree of attenuation) control of the variable gain attenuator 2 is exercised based on the error frame count T of the received data and the power value Pin for a signal output by the band-pass filter 5. Therefore, unlike a conventional radio receiver that limits cross-mutilation, depending on whether a synchronous frame signal is detected, cross-modulation due to a jamming signal can be adequately excluded from a desired wave, even when a signal for frame synchronization transmitted having a higher signal strength than another channel signal is being transmitted. Furthermore, when cross-modulation occurs after synchronization is acquired, the effect of the cross-modulation can be limited.

In addition, when it is ascertained that deterioration of the quality of received data due to cross-modulation has been reduced (the quality of received data has been recovered), the degree of attenuation provided by the variable gain controller 2 can be reduced to avoid the deterioration of the quality of received data due to thermal noise, or the deterioration of the quality of received data due to newly occurring cross-modulation.

In the above embodiment the frame error count has been employed as the quality deterioration index; however, a symbol (bit) error count can be employed. When the maximum likelihood determination, such as Viterbi decoding, is performed for frame decoding, the obtained likelihood can be employed.

In the above description, the magnitudes of the signals Vatt_up and Vatt_down output by the gain control signal generator 95 of the gain controller 9 have a constant value, regardless of the difference between the quality deterioration index T and the threshold value TH1 or the difference between the value Pin and the value Pinit. However, a partially proportional relationship may be provided for the difference between each parameter and a threshold value, and the change in the degree of attenuation. The above described control method is merely an example, and the present invention is not limited to this method.

In the above radio receiver, the gain controller 9 outputs the signal voltage Vatt that corresponds to the degree of attenuation provided by the variable gain attenuator 2. By providing the functions of the adder 96 and the delay section 97 for the variable gain attenuator 2, the gain controller 9 may output a signal that corresponds to the change in the degree of attenuation.

In the radio receiver in this embodiment, the demodulator 8 performs de-spread process while assuming that a digital modulated signal has been received for which direct sequence spectrum spreading has been performed. The despreading process may be performed by the frequency converter 4. More specifically, the frequency converter 4 may have a function for multiplying a received high frequency signal by the same PN sequence as used for the direct sequence spectrum spreading, and a frequency conversion function for converting into an intermediate frequency signal the first modulated signal obtained by the inverted spreading. These functions can be provided by a PN code generator, a local oscillator, a balanced modulator for performing the balanced modulation of a PN code and a local frequency signal, and a frequency mixer for mixing the frequencies of a balanced modulation signal and a received high frequency signal.

Further, the present invention is not limited to the direct sequence spectrum spreading modulation system, and can be applied for a radio receiver employing a narrow band modulation system, such as phase-shift keying (PSK) or frequency-shift keying (FSK), that does not perform spectrum spreading.

According to the present invention, a quality deterioration index for received data, which is detected and measured by the error detection means, and the power value of a signal, which is output by the band-pass filter, are employed as parameters to control the degree of attenuation provided by the variable gain attenuation means provided at the front end of the reception unit. Thus, even when according to North American Standard TIA.IS-95 a base station is transmitting a signal that is related to frame synchronization and has higher strength than another channel signal, the effect of cross-modulation due to a jamming signal can be excluded from a desired wave.

In addition, even when deterioration of the quality of a received high frequency signal occurs as a result of cross-modulation after synchronization has been acquired, the effect of the cross-modulation can be limited, and a radio receiver having high reception sensitivity can be provided.

Furthermore, when the quality of received data has been recovered, the degree of attenuation provided by the variable gain attenuation means is reduced, so that the deterioration of the reception quality due to thermal noise can be prevented and the deterioration of the quality due to newly occurring cross-modulation can also be limited. As a result, a radio receiver having high and stable reception sensitivity can be provided.

In particular, the sensitivity of a radio receiver defined in one of claims 2 to 7 is such that it can receive data more stably because multiple values or contiguous values are employed as a quality deterioration index.

According to the invention cited in claim 8 or claim 9, a reception system that employs the direct sequence spectrum spreading is especially effective in limiting the deterioration of the quality of received data, which is caused by cross-modulation. Therefore, in code division multiple access (CDMA) communication employing direct sequence spectrum spreading, the effect of cross-modulation can be limited.

What is claimed is:

1. A radio receiver for receiving a modulated digital signal comprising:
   variable gain attenuation means for limiting a signal level of a high frequency signal that is received;
   high frequency amplification means for amplifying said high frequency signal output by said variable gain attenuation means;
   frequency conversion means for converting into an intermediate frequency signal said high frequency signal that is amplified;
   a band-pass filter for permitting a passage only of predetermined frequency band of said intermediate frequency signal;
   variable gain intermediate frequency amplification means for amplifying a signal passed through said band-pass filter and for exercising automatic gain control to output an amplified signal having constant average power;
   demodulation means for demodulating a signal output by said variable gain intermediate frequency amplification means to obtain a baseband signal, and for outputting received data;
   error detection means for detecting an error in said received data and for outputting a quality deterioration index representing deterioration of quality of said received data; and
   gain control means for employing the magnitude of a signal output by said band-pass filter and said quality deterioration index to control the degree of gain attenuation performed by said variable gain attenuation means, said gain control means ascertaining, when deterioration in quality of said received data is detected based on said quality deterioration index, that said quality of said high frequency signal that is received has been deteriorated, and increasing said degree of gain attenuation provided by said variable gain attenuation means when said magnitude of said signal output by said band-pass filter is equal to or greater than a predetermined value, and reducing said degree of gain attenuation when said magnitude of said signal is smaller than said predetermined value.

2. A radio receiver according to claim 1, wherein said error detection means detects and measures errors in said received data and outputs said quality deterioration index, and wherein said gain control means includes comparison means for comparing a quality deterioration threshold value, which is determined in advance for said quality deterioration index, with said quality deterioration index output by said error detection means;
   wherein, as a result obtained by said comparison means, when said quality deterioration index output by said error detection means exceeds said quality deterioration threshold value, it is ascertained that deterioration of said quality of said high frequency signal that is received has occurred, and wherein when the magnitude of said signal output by said band-pass filter is equal to or greater than a predetermined value, the degree of attenuation provided by said variable gain attenuation means is increased, and when said magnitude is smaller than said predetermined value, said degree of attenuation is reduced.

3. A radio receiver according to claim 2, wherein said error detection means detects and measures symbol errors included in said received data, and outputs as said quality deterioration index a symbol error count for a predetermined number of frames.

4. A radio receiver according to claim 2, wherein said error detection means detects and measures an error in a received frame by using for error detection a symbol that is added in advance to said frame, and outputs as said quality deterioration index a frame error count for a predetermined number of frames.

5. A radio receiver according to claim 2, wherein said error detection means measures a frame error count in said received frame by using a likelihood obtained by determining a maximum likelihood, and outputs said frame error count as said quality deterioration index.

6. A radio receiver according to claim 2, wherein said gain control means includes:
   first storage means for storing a first threshold value for quality deterioration that is defined in advance relative to said quality deterioration index;
   first comparison means for comparing said first threshold value stored in said first storage means with said quality deterioration index output by said error detection means;
   second storage means for storing a second threshold value that is defined in advance for the magnitude of said signal output by said band-pass filter;
   second comparison means for comparing said second threshold value stored in said second storage means with said magnitude of said signal output by said band-pass filter; and
   control signal output means for employing a result obtained by said first comparison means and a result obtained by said second comparison means to output a control signal for controlling said degree of attenuation provided by said variable gain attenuation means, said signal output means ascertaining, when said first comparison means determines that said quality deterioration index exceeds said first threshold value, that deterioration of said quality of said high frequency signal has occurred and outputting either a control signal to increase said degree of attenuation provided by said variable gain attenuation means, when said second comparison means determines that said magnitude of said signal output by said band-pass filter is equal to or greater than said second threshold value, or a control signal to reduce said degree of attenuation, when said second comparison means determines that said magnitude of said signal output by said band-pass filter is smaller than said threshold value.

7. A radio receiver according to claim 2, wherein said gain control means includes:
   first storage means for storing a first threshold value for quality deterioration that is defined in advance relative to said quality deterioration index;
   first comparison means for comparing said first threshold value stored in said first storage means with said quality deterioration index output by said error detection means;
   second storage means for storing a second threshold value that is defined in advance for said magnitude of said signal output by said band-pass filter;
   second comparison means for comparing said second threshold value stored in said second storage means with said magnitude of said signal output by said band-pass filter;
   third storage means for storing a third threshold value for quality recovery that is smaller than said first threshold value and that is defined in advance for said quality deterioration index;
   third comparison means for comparing said third threshold value stored in said third storage means with said quality deterioration index output by said error detection means;
   control signal output means for employing a result obtained by said first comparison means, a result obtained by said second comparison means and a result obtained by said third comparison means to output a control signal for controlling said degree of attenuation provided by said variable gain attenuation means, said control signal output means ascertaining, when said first comparison means determines that said quality deterioration index exceeds said first threshold value, that deterioration of said quality of said high frequency signal has occurred, and said control signal output means outputting, when said second comparison means determines that said magnitude of said signal output by said band-pass filter is equal to or greater than said second threshold value, a control signal to increase said degree of attenuation provided by said variable gain attenuation means until said quality deterioration index is smaller than said threshold value for quality recovery stored in said third storage means, or outputting, when said second comparison means determines that said magnitude of said signal output by said band-pass filter is smaller than said threshold value, a control signal to reduce said degree of attenuation; and updating means for, when said degree of attenuation provided by said variable gain attenuation means is increased by said control signal output means and said third comparison means determines that said quality deterioration index is smaller than said third threshold value for said quality recovery, updating said second threshold value stored in said second storage means, said updating means updating the contents stored in said second storage means by employing the magnitude of a signal currently output by said band-pass filter as a new second threshold value.

8. A radio receiver according to claim 1, wherein said frequency conversion means performs de-spread processing by multiplying said high frequency signal, which is obtained by performing direct sequence spread spectrum modulation using a PN sequence, by said PN sequence that is employed for said direct sequence spectrum modulation, and wherein said frequency conversion means converts said high frequency signal into an intermediate frequency signal.

9. A radio receiver according to claim 1, wherein said frequency conversion means converts said high frequency signal, which is obtained by said direct sequence spectrum modulation using a PN sequence, into an intermediate frequency signal; wherein said band-pass filter permits the passage only of predetermined frequency band elements of said intermediate frequency signal that correspond to said PN sequence used for said direct sequence spectrum modulation; and wherein, in order to obtain said baseband signal that is multiplied by said PN sequence, said demodulation means demodulates a signal output by said variable intermediate frequency amplification means and, in order for said received data to be decoded, performs de-spread processing by multiplying said baseband signal by the same PN series as is used for said direct sequence spectrum modulation.

* * * * *